US010153185B2

(12) United States Patent
Du Bois et al.

(10) Patent No.: US 10,153,185 B2
(45) Date of Patent: Dec. 11, 2018

(54) SUBSTRATE TEMPERATURE MEASUREMENT IN MULTI-ZONE HEATER

(71) Applicant: Applied Materials, Inc., Santa Clara, CA (US)

(72) Inventors: Dale R. Du Bois, Los Gatos, CA (US); Bozhi Yang, Santa Clara, CA (US); Jianhua Zhou, Campbell, CA (US); Sanjeev Baluja, Campbell, CA (US); Amit Kumar Bansal, Sunnyvale, CA (US); Juan Carlos Rocha-Alvarez, San Carlos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 410 days.

(21) Appl. No.: 14/761,214

(22) PCT Filed: Feb. 7, 2014

(86) PCT No.: PCT/US2014/015344
§ 371 (c)(1),
(2) Date: Jul. 15, 2015

(87) PCT Pub. No.: WO2014/158370
PCT Pub. Date: Oct. 2, 2014

(65) Prior Publication Data
US 2015/0371881 A1  Dec. 24, 2015

Related U.S. Application Data

(60) Provisional application No. 61/783,099, filed on Mar. 14, 2013.

(51) Int. Cl.
*G01K 1/14* (2006.01)
*H01L 21/67* (2006.01)
(Continued)

(52) U.S. Cl.
CPC .......... *H01L 21/67248* (2013.01); *G01K 1/08* (2013.01); *G01K 1/14* (2013.01);
(Continued)

(58) Field of Classification Search
None
See application file for complete search history.

(56) References Cited

U.S. PATENT DOCUMENTS 5,636,963 A      6/1997  Haraguchi et al.
2002/0017363 A1*  2/2002  Nakashima ......... C23C 16/4584
                                                   156/345.12

(Continued)

FOREIGN PATENT DOCUMENTS

CN      1111033 A      11/1995
JP      05-082042 U    11/1993
(Continued)

OTHER PUBLICATIONS

Taiwanese Office Action (with attached English translation) for Application No. 103104448; dated Jul. 18 2017; 7 total pages.
(Continued)

*Primary Examiner* — Lisa Caputo
*Assistant Examiner* — Nasir U Ahmed
(74) *Attorney, Agent, or Firm* — Patterson + Sheridan LLP

(57) ABSTRACT

Embodiments of the present disclosure generally provide apparatus and methods for monitoring one or more process parameters, such as temperature of substrate support, at various locations. One embodiment of the present disclosure provides a sensor column for measuring one or more parameters in a processing chamber. The sensor column includes a tip for contacting a chamber component being measured, a protective tube having an inner volume extending from a first end and second end, wherein the tip is attached to the
(Continued)

first end of the protective tube and seals the protective tube at the first end, and a sensor disposed near the tip. The inner volume of the protective tube houses connectors of the sensor, and the tip is positioned in the processing chamber through an opening of the processing chamber during operation.

14 Claims, 10 Drawing Sheets

(51) Int. Cl.
    *H01L 21/687* (2006.01)
    *G01K 1/08* (2006.01)
    *G01K 7/02* (2006.01)
    *G01K 7/16* (2006.01)
    *G01K 13/00* (2006.01)

(52) U.S. Cl.
    CPC ............... *G01K 7/02* (2013.01); *G01K 7/16* (2013.01); *G01K 13/00* (2013.01); *H01L 21/68742* (2013.01); *H01L 21/68792* (2013.01)

(56) References Cited

U.S. PATENT DOCUMENTS

| | | | | |
|---|---|---|---|---|
| 2004/0208228 | A1* | 10/2004 | Hashikura | G01K 1/08 374/179 |
| 2005/0092246 | A1* | 5/2005 | Baumann | C23C 16/4586 118/715 |
| 2008/0110397 | A1* | 5/2008 | Son | H01L 21/68742 118/500 |
| 2009/0052498 | A1* | 2/2009 | Halpin | G01K 7/04 374/179 |
| 2010/0024723 | A1* | 2/2010 | Hasegawa | H01J 37/32743 118/500 |
| 2010/0282163 | A1* | 11/2010 | Aggarwal | G01K 7/04 118/666 |
| 2010/0294199 | A1* | 11/2010 | Tran | C23C 16/4401 118/723 R |
| 2012/0291709 | A1 | 11/2012 | Smith et al. | |
| 2013/0284374 | A1* | 10/2013 | Lubomirsky | H02N 13/00 156/345.51 |

FOREIGN PATENT DOCUMENTS

| | | |
|---|---|---|
| JP | 07-221154 A | 8/1995 |
| KR | 10-2012-0073881 A | 7/2012 |
| TW | 200717684 A | 5/2007 |

OTHER PUBLICATIONS

Chinese Office Action (with attached English translation of the Search Report) for Application No. 201480008665.5; dated Mar. 13, 2017; 10 total pages.

International Search Report and Written Opinion dated Sep. 16, 2014 for Application No. PCT/US2014/015344.

* cited by examiner

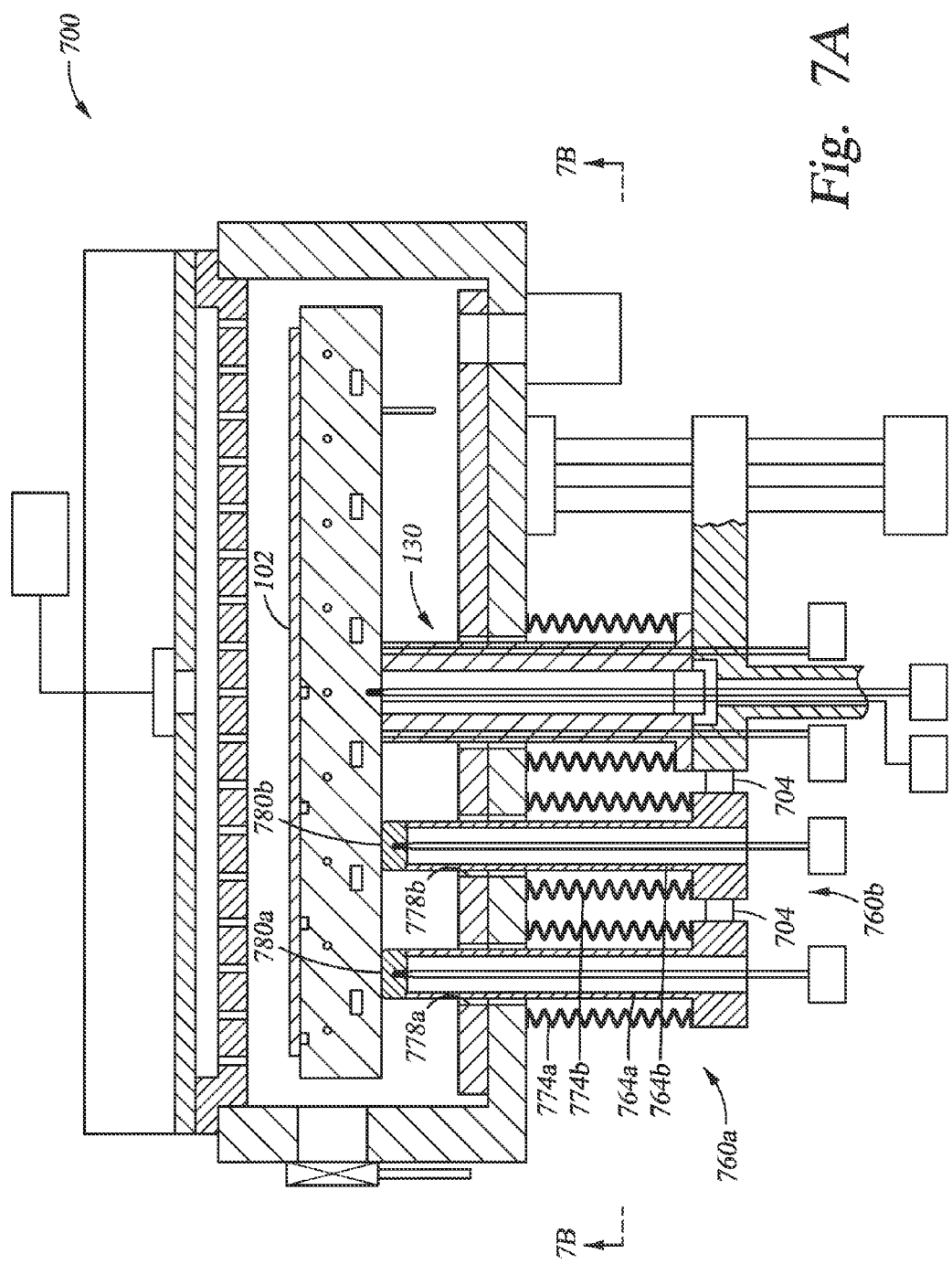

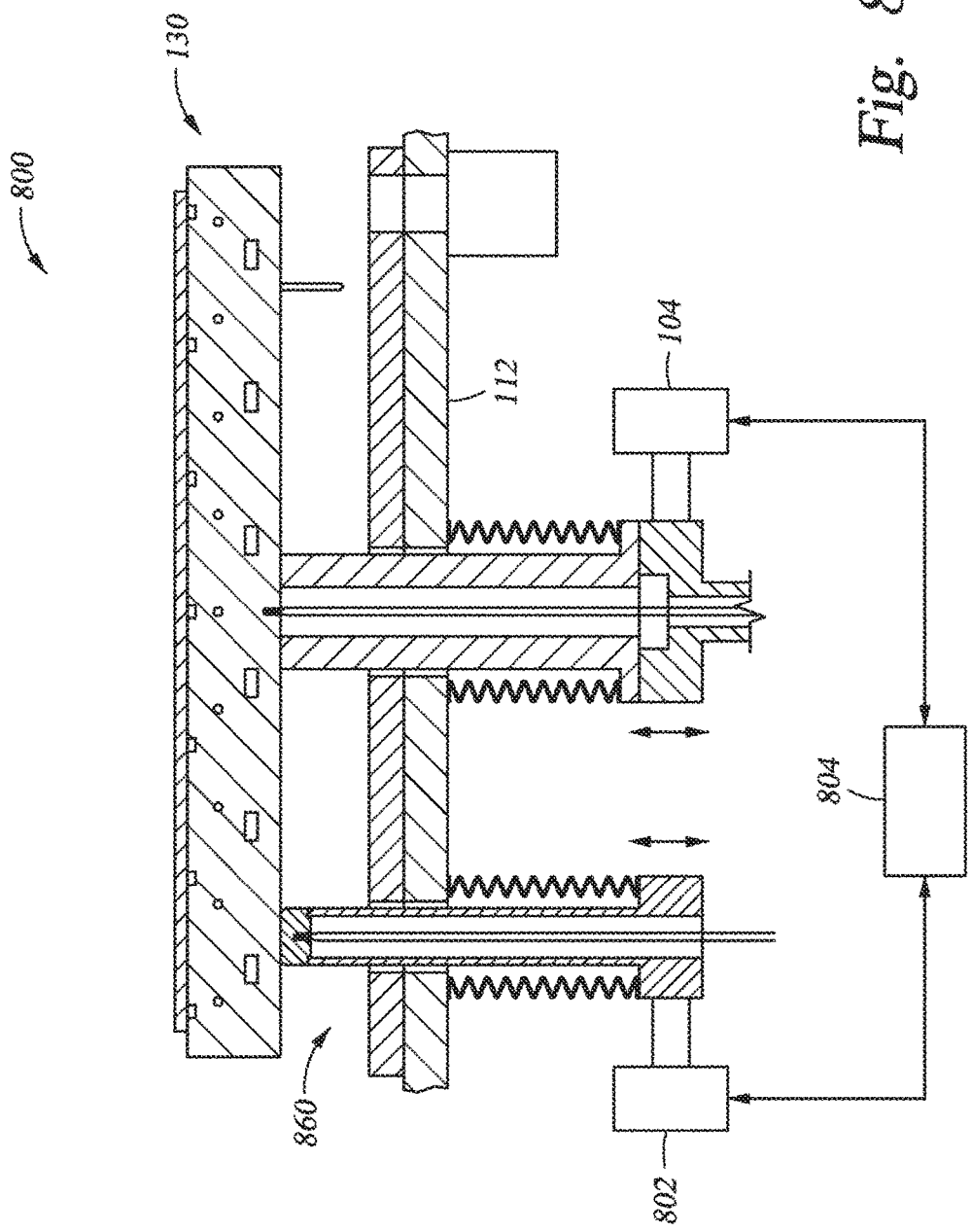

SUBSTRATE TEMPERATURE MEASUREMENT IN MULTI-ZONE HEATER

BACKGROUND

Field

Embodiments of the present disclosure relate to apparatus and methods for processing semiconductor substrates. More particularly, embodiments of the present disclosure relate to apparatus and methods for monitoring one or more parameters at various locations in a processing chamber.

Description of the Related Art

During manufacturing of semiconductor devices, a substrate is usually processed in a processing chamber, where deposition, etching, thermal processing may be performed to the substrate. When a process requires the substrate being processed to be heated to and/or maintained at certain temperatures, a substrate support assembly including one or more heaters may be used. However, as the size of the substrate being processed increases, it becomes challenging to maintain uniform temperature across the substrate support and the substrate because temperatures at various locations, such as at various radii of the substrate support, may be different. Traditionally, infrared sensors positioned through optical windows are used to measure temperatures at various locations. However, infrared sensor systems are not only expensive but also not dependable because the accuracy strongly depends on emissivity of components being measured which changes over time. Other solutions, such as using multiple thermal sensors embedded in the substrate support and monitoring electrical resistivity of one or more heating elements, may be impractical or not suitable for some ranges of processing temperatures.

Therefore, there is a need for apparatus and methods for improved monitoring temperature or other process parameters at various locations of a substrate support.

SUMMARY

Embodiments of the present disclosure generally provide apparatus and methods for monitoring one or more process parameters, such as temperature of substrate support, at various locations.

One embodiment of the present disclosure provides a sensor column for measuring one or more parameters in a processing chamber. The sensor column includes a tip for contacting a chamber component being measured, a protective tube having an inner volume extending from a first end and second end, wherein the tip is attached to the first end of the protective tube and seals the protective tube at the first end, and a sensor disposed near the tip. The inner volume of the protective tube houses connectors of the sensor, and the tip is positioned in the processing chamber through an opening of the processing chamber during operation.

Another embodiment of the present disclosure provides a substrate support assembly. The substrate support assembly includes a substrate support body having an upper surface for supporting a substrate thereon, a support shaft extending from a backside of the substrate support body, wherein the support shaft is movable along a longitudinal axis to move the substrate support body, and a sensor column having a tip for contacting the backside of the substrate support body, wherein the sensor column is synchronically movable with the support shaft to maintain the contact between the tip and the backside of the substrate support body.

Another embodiment of the present disclosure provides a processing chamber. The processing chamber includes a chamber body defining a processing volume, and a substrate support assembly. The substrate support assembly includes a substrate support body disposed in the processing volume having an upper surface for supporting a substrate thereon, a support shaft extending from a backside of the substrate support body to an exterior of the chamber body through a shaft opening formed through the chamber body, wherein the support shaft is movable along a longitudinal axis to move the substrate support body, and a sensor column having a tip for contacting the backside of the substrate support body, wherein the sensor column extends to exterior of the chamber body through a sensor opening formed through the chamber body, the sensor column is synchronically movable with the support shaft to maintain the contact between the tip and the backside of the substrate support body.

Yet another embodiment of the present disclosure provides a method for processing a substrate. The method includes positioning a substrate on an upper surface of a substrate support body disposed in a processing volume of a processing chamber, moving the substrate support body and a sensor column in a synchronized manner to a processing position in the processing volume, wherein a tip of the sensor column contacts a backside of the substrate support body, and processing the substrate in the processing volume while monitoring a sensor signal from a sensor disposed in the sensor column.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 7A is a schematic sectional view of a processing chamber having two or more sensor columns according to one embodiment of the present disclosure.

FIG. 8 is a schematic partial sectional view of a processing chamber having a sensor column according another embodiment of the present disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure provide apparatus and methods for measuring one or more processing parameters, such as temperature, at various locations of a processing chamber. One embodiment of the present disclosure provides a processing chamber having one or more sensor columns disposed parallel to a support shaft of a substrate support. The one or more sensor columns move up and down with the substrate support in synchronization so that a tip of each of the one or more sensor columns maintains contact with a backside of the substrate support. The one or more sensor columns may be positioned along various radii of the substrate support to measure local process temperature. By positioning sensors in one or more synchronized sensor columns, embodiments of the present disclosure provides a low cost and reliable measure of process parameters, such as temperature, at different locations in the processing chamber.

In one embodiment, the sensor column includes a double bellows structure having an outer bellows for providing vacuum seal and an inner bellows for providing a spring force to bias the tip of the sensor column against the backside of the substrate support. The double bellows structure enables intimate contact between the tip of the sensor column and the backside of the substrate support in a wide range of temperatures without being affected by mismatch caused by thermal expansion.

Figure 1:
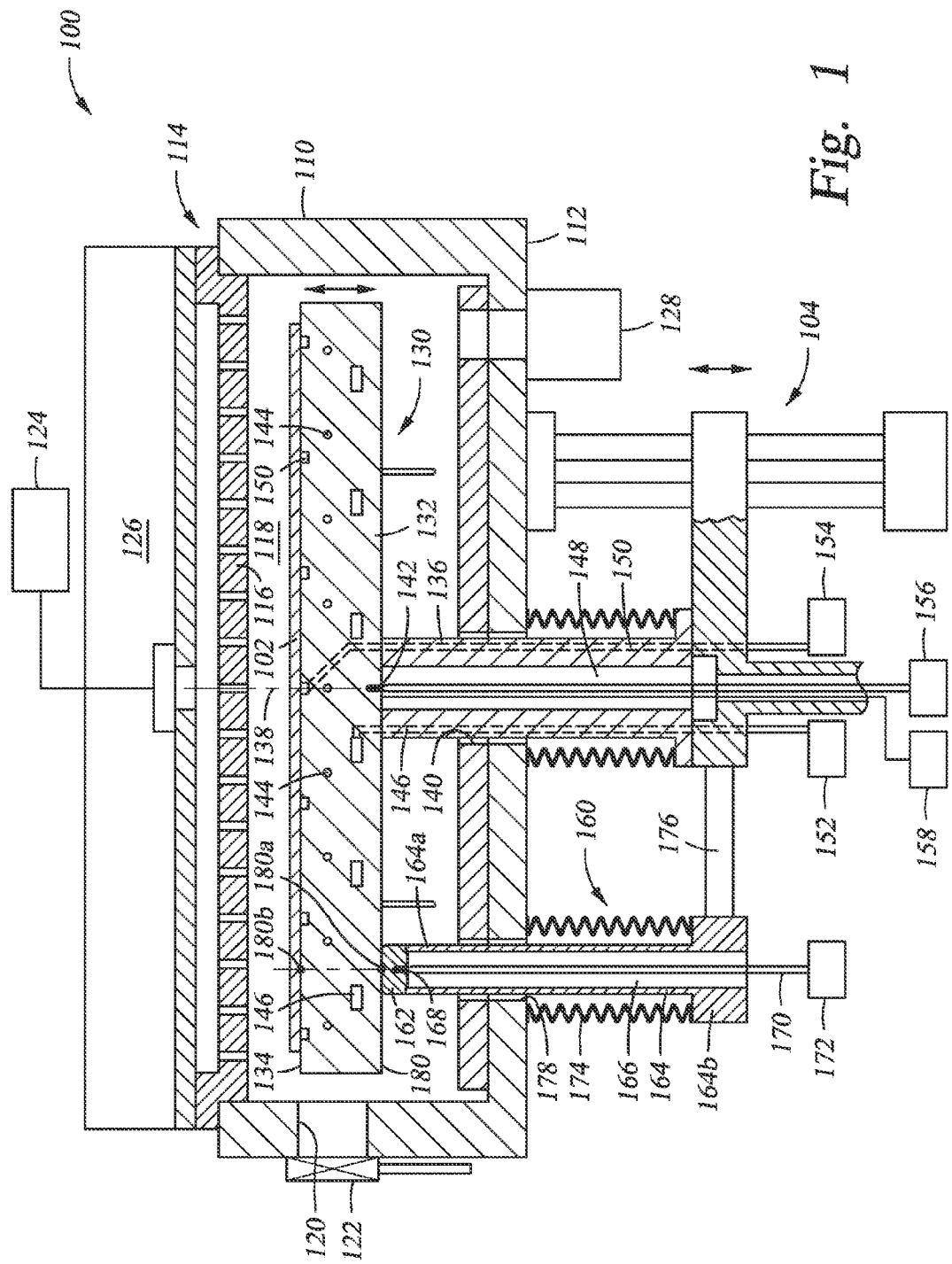
FIG. 1 is a schematic sectional view of a processing chamber according to one embodiment of the present disclosure.

FIG. 1 is a schematic sectional view of a processing chamber 100 according to one embodiment of the present disclosure. The processing chamber 100 includes a substrate support assembly 130 and a sensor column 160 moving with the synchronically with the substrate support assembly 130 for measuring one or more parameters by contacting the substrate support assembly 130. The processing chamber 100 may be used for deposition, etching or thermal processing.

The processing chamber 100 includes chamber walls 110, a chamber bottom 112 and a lid assembly 114 defining a processing volume 118. The substrate support assembly 130 is disposed in the processing volume 118 for supporting a substrate 102 thereon. The lid assembly 114 may include a showerhead 116 for distributing one or more processing gas from a gas source 124 to the processing volume 118. A vacuum system 128 may be coupled to the processing volume 118 for pumping the processing volume 118. A slit valve opening 120 may be formed through the chamber walls 110 to allow passage of substrates. A slit valve door 122 may be coupled to one of the chamber walls 110 to selectively open or close the slit valve opening 120. Optionally, the lid assembly 114 may be UV transparent and a UV assembly 126 may be disposed over the lid assembly 114 for perform UV treatment, such as annealing, to the substrate 102.

The substrate support assembly 130 generally includes a substrate support body 132 having a substantially planar substrate supporting surface 134 on which the substrate 102 is disposed. The substrate support body 132 may be a circular disk. A support shaft 136 extends from a backside of the substrate support body 132 along a central axis 138. The support shaft 136 extends out the processing volume 118 through an opening 140 on the chamber bottom 112. The support shaft 136 is further connected to an actuator 104 to vertically move the support shaft 136 and substrate support body 132.

The support shaft 136 may be hollow having an inner volume 148 to accommodate electrical and/or sensor connectors. In one embodiment, the substrate support assembly 130 includes one or more sensors 142 embedded in the substrate support body 132. In one embodiment, the one or more sensors 142 may include one or more sensors disposed near the central axis 138. In one embodiment, the one or more sensors 142 may be temperature sensor, such as thermocouple, resistance temperature detector, thermistor, or any other applicable temperature sensors. The one or more sensors 142 may have connectors extending through the inner volume 148 of the support shaft 136 towards a data collector 156.

The substrate support assembly 130 further includes one or more heaters 144 embedded in the substrate support body 132. In one embodiment, the one or more heaters 144 includes an inner heater for heating a region close to the central axis 138 and an outer heater for heating a region radially away from the central axis 138. In another embodiment, the one or more heaters 144 may include multiple heaters each positioned to heat one zone in the substrate support body 132. In one embodiment, each of the one or more heaters 144 may be individually controlled. The one or more heaters 144 may be connected to a power source 158 through cables disposed in the inner volume 148 of the support shaft 136.

The substrate support body 132 also includes cooling channels 146 for circulating a cooling fluid through the substrate support body 132 to provide cooling to the substrate support body 132 and the substrate 102 thereon. A portion of the cooling channels 146 may be formed through sidewall of the support shaft 136 to further connect with a cooling fluid source 152.

The substrate support body 132 may include a plurality of vacuum channels 150 open to the substrate supporting surface 134 of the substrate support body 132. The plurality of vacuum channels 150 may be used to secure the substrate 102 on the substrate supporting surface 134 by vacuum chuck. A portion of the vacuum channels 150 may be formed through sidewall of the support shaft 136 to further connect to a vacuum source 154.

The sensor column 160 includes a tip 162 for contacting a component to be measured. A protective tube 164 is attached to the tip 162. The protective tube 164 is hollow having an inner volume 166. The tip 162 is attached to an upper end 164a of the protective tube 164 and seals the inner volume 166 at the upper end 164a. The sensor column 160 further includes a sensor 168 disposed near the tip 162. Connectors 170 of the sensor 168 extend through the inner volume 166 of the protective tube 164 and exit the protective tube 164 at a lower end 164b. The connectors 170 may further connect to a data collector 172.

During operation, the tip 162 and a portion of the protective tube 164 enter the processing volume 118 through an opening 178 so that the tip 162 may contact a component in the processing volume 118 to be measured by the sensor 168. In one embodiment, the opening 178 may be formed through chamber bottom 112 and the tip 162 is positioned to contact a backside 180 of the substrate support body 132.

The sensor column 160 further includes a bellows 174 coupled between the lower end 164b of the protective tube 164 and the chamber bottom 112 to seal the processing volume 118 around the opening 178. FIG. 1 shows that the bellows 174 is disposed outside the processing volume 118. Alternatively, the bellows 174 may be positioned inside the processing volume 118.

In one embodiment, a bracket 176 may be fixedly coupled between the protective tube 164 and the substrate support assembly 130 to move vertically with the substrate support assembly 130.

Even though only one sensor 168 is shown in FIG. 1, the sensor column 160 may include two or more sensors for measuring suitable parameters. In one embodiment, the sensor 168 includes a temperature sensor for measuring the temperature of the substrate support body 132 at a contact point 180a. The temperature sensor may be a thermocouple, a resistance temperature detector, a thermistor, or any other applicable temperature sensor. The tip 162 may formed from a material having high thermal conductivity so that the temperature of the tip 162 changes rapidly with the temperature of the substrate support body 132 at the contact point 180a. The sensor 168 contacting the tip 162 can therefore measure the temperature of the tip 162. In one embodiment, a temperature offset between the tip 162 and a point 180b on the substrate 102, wherein the point 180b vertically corresponds to the contact point 180a, may be calibrated by empirically or by software so that the measurement of the sensor 168 reflects temperature of the substrate 102 at the point 180b.

The tip 162 and the protective tube 164 may be formed from a ceramic having high heat conductivity and compatible with processing chemistry. In one embodiment, the tip 162 may be formed from aluminum nitride or aluminum oxide. The protective tube 164 may be formed by aluminum oxide. The tip 162 and the protective tube 164 may be unitarily formed or joined together by brazing or by a bonding material.

Even though only one sensor column 160 is shown in FIG. 1, the processing chamber 100 may include a plurality of sensor columns 160 positioned at different locations. In one embodiment, the processing chamber 100 may include the plurality of sensor columns 160 are positioned to each measure a heating zone corresponding to one or more heaters 144 to facilitate independent control of each of the one or more heaters 144. The sensor column 160 may be maintained and/or replaced through the opening 178 without opening the lid assembly 114 therefore convenient to maintain.

Figure 2:
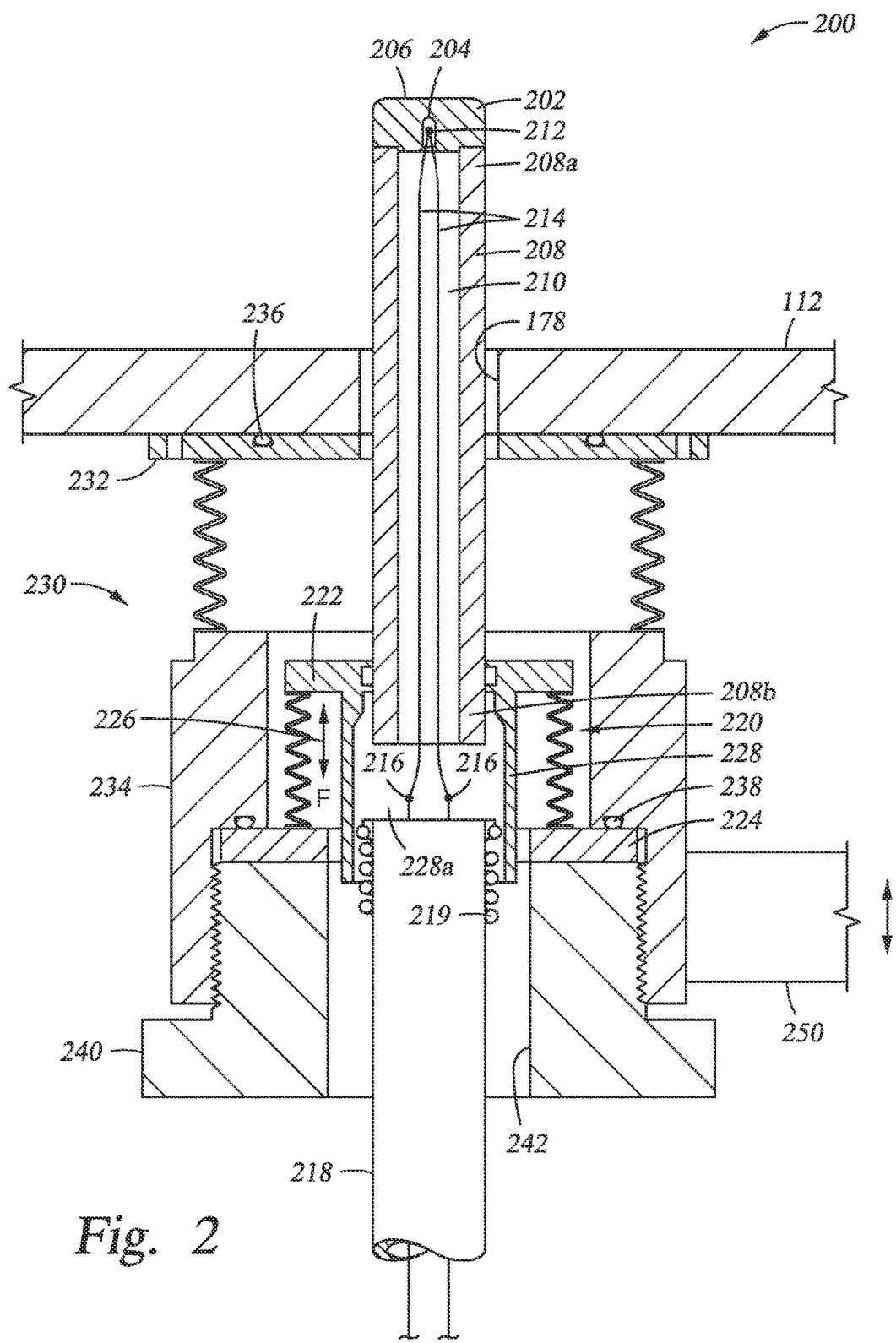
FIG. 2 is a schematic sectional view of a sensor column according to one embodiment of the present disclosure.

FIG. 2 is a schematic sectional view of a sensor column 200 according to one embodiment of the present disclosure. The sensor column 200 includes a double-bellows structure. The sensor column 200 may be used to replace any sensor column described in the embodiments of the present disclosure.

The sensor column 200 includes a tip 202 having an exterior surface 206 for contacting a component being measured. The tip 202 includes a sensor well 204 formed opposite to the exterior surface 206. The sensor well 204 receives a sensor 212 therein.

A protective tube 208 is attached to the tip 202. The protective tube 208 is hollow having an inner volume 210. The tip 202 is attached to an upper end 208a of the protective tube 208 and seals the inner volume 210 at the upper end 208a.

The sensor 212 may be spring loaded in the sensor well 204 to achieve solid contact between the tip 202 and the sensor 212. Connectors 214 of the sensor 212 extend through the inner volume 210 of the protective tube 208 and exit the protective tube 208 at a lower end 208b.

An inner bellows 220 is attached to the protective tube 208 near the lower end 208b for biasing the tip 202 upwards. An upper cap 222 of the inner bellows 220 is fixedly connected to the protective tube 208. In one embodiment, the upper cap 222 may be joined to the protective tube 208 by brazing. An inner tube 228 may extend from the upper cap 222 and form an inner volume 228a. Junctions 216 of the sensor 212 may be housed in the inner volume 228a. A sensor transition 218 may be attached to the inner tube 228. A coil spring 219 may be positioned between the inner tube 228 and the sensor transition 218 for strain relief.

The sensor column 200 further includes an outer bellows 230 disposed outside the inner bellows 220. The outer bellows 230 is positioned to provide a vacuum seal around the opening through which the protective tube 208 passes through. In one embodiment, an upper connector 232 of the outer bellows 230 is attached to the chamber bottom 112 to seal the opening 178. A lower connector 234 of the outer bellows 230 is secured to a lower cap 224 of the inner bellows 220 by a lock nut 240. The inner bellows 220 is positioned so that the inner bellows 220 exerts a spring force 226 pushing the tip 202 upwards to facilitate a solid contact between the tip 202 and the component to be measured.

The lock nut 240 may have a central opening 242 through which the inner tube 228 of the inner bellows 220 and the sensor transition 218 passing though. A seal 236 may be disposed between the upper connector 232 and the chamber bottom 112 and a seal 238 may be disposed between the lower connector 234 and the lower 506 224 to achieve air tight seal. In one embodiment, the seals 236, 238 may be O-ring seals. The lower connector 234 of the outer bellows 230 may further connect to a bracket 250 coupled to an actuator (not shown) to move the protective tube 208 and the tip 202 vertically.

Figure 3:
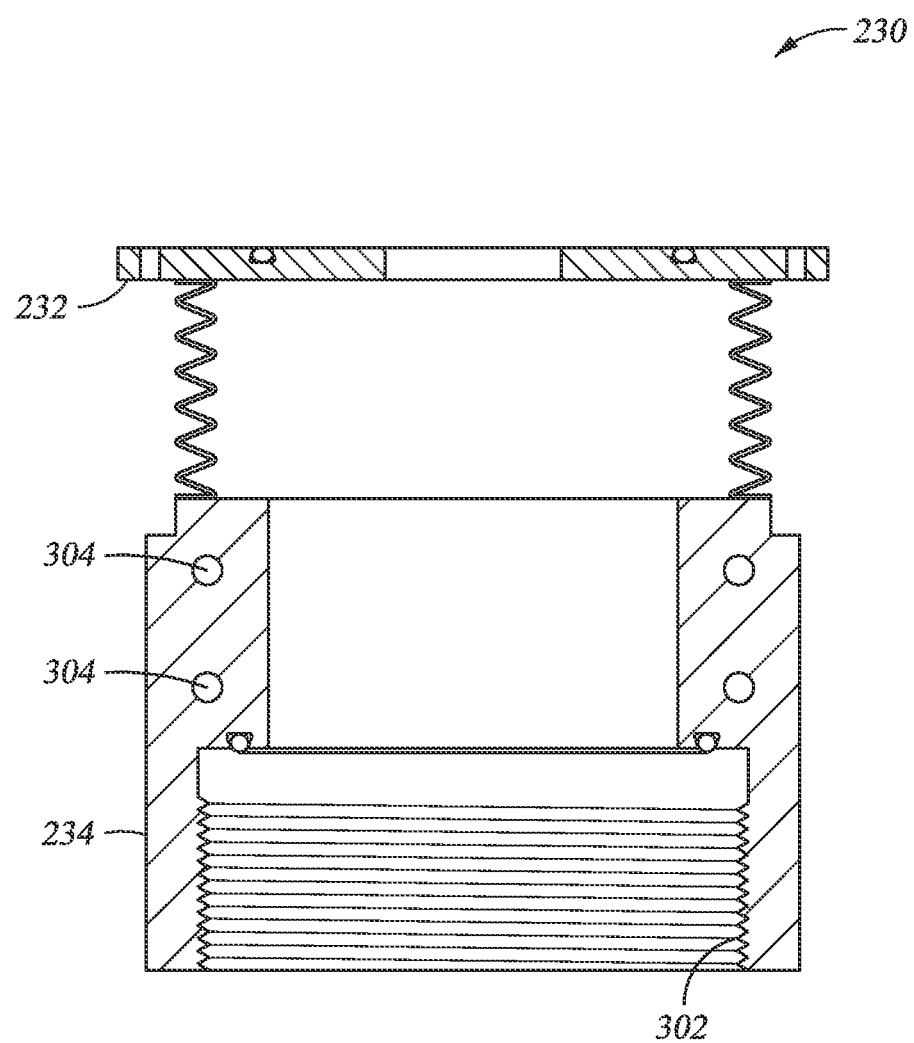
FIG. 3 is a schematic sectional view of an outer bellows according to one embodiment of the present disclosure.

FIG. 3 is a schematic sectional view of the outer bellows 230 according to one embodiment of the present disclosure. The lower connector 234 may include inner threads to couple with the lock nut 240 shown in FIG. 2. The lower connector 234 may also include fastening means 304, such as screw holes, to connect with an actuator directly or indirectly.

Figure 4:
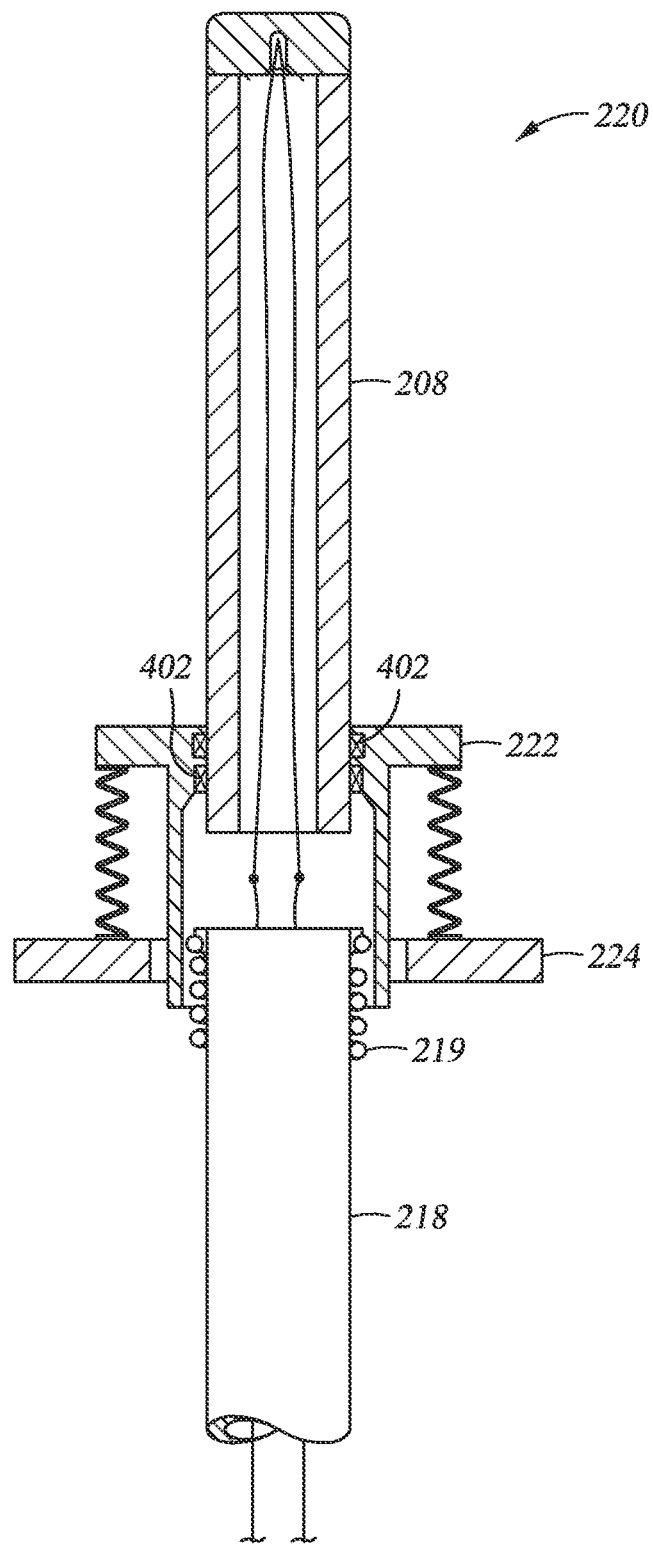
FIG. 4 is a schematic sectional view of an inner bellows according to one embodiment of the present disclosure.

FIG. 4 is a schematic sectional view of the inner bellows 220 according to one embodiment of the present disclosure. The upper cap 222 may be attached to the protective tube 208 by a bonding portion 402. In one embodiment, the bonding portion 402 may be brazing joint.

Figure 5C:
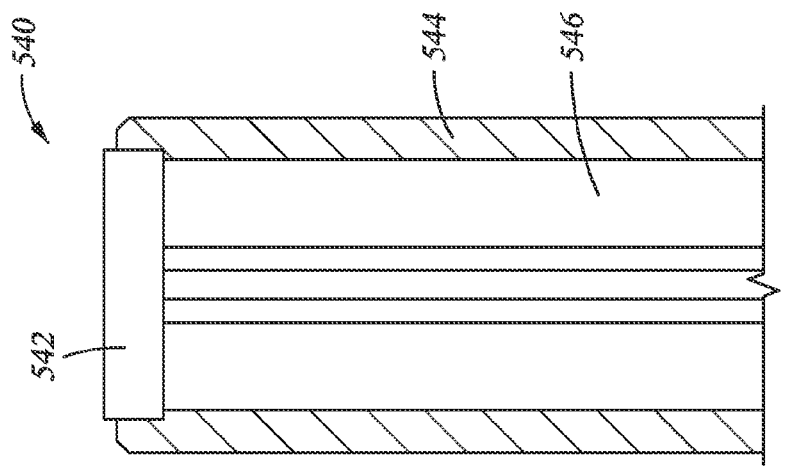
FIGS. 5A-5C are schematic sectional views of a sensor housing according to embodiments of the present disclosure.
Figure 5B:
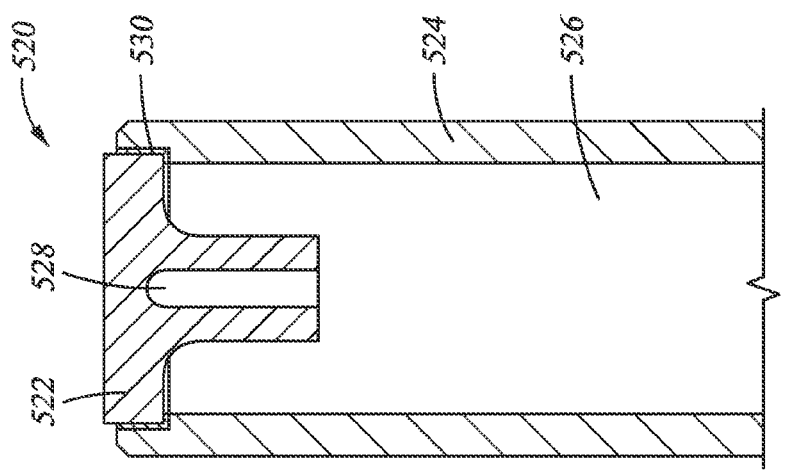
Figure 5A:
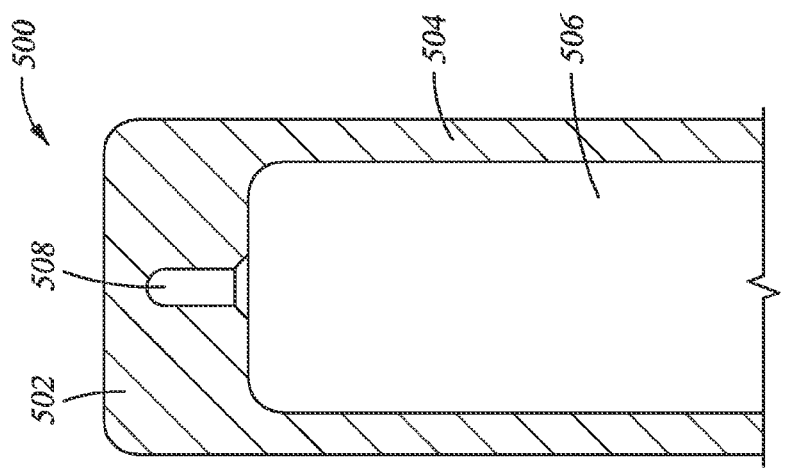

FIG. 5A is a schematic sectional view of a sensor housing 500 according to embodiments of the present disclosure. The sensor housing 500 is a unitary body having a tip 502 and a protective tube 504. The tip 502 and the protective tube 504 form an inner volume 506 for housing one or more sensors. A sensor well 508 is formed in the tip 502 from the inner volume 506. The sensor well 508 may be machined through the inner volume 506. The sensor well 508 may be sized to allow a sensor, such as a thermal couple, to be spring loaded therein. The sensor housing 500 may be formed from any thermal conductive material, such as ceramic and metal. In one embodiment, the sensor housing 500 is formed from aluminum nitride. In another embodiment, the sensor housing 500 is formed from aluminum oxide. Being unitary, the sensor housing 500 provides excellent vacuum seal around the sensor. The sensor well 508 allows the sensor to be replaced without replacing the sensor housing 500.

FIG. 5B is a schematic sectional view of a sensor housing 520 according to embodiments of the present disclosure. The sensor housing 520 includes a tip 522 and a protective tube 524 bonded together. The tip 522 has a sensor well 528 formed therein. The sensor well 528 opens to an inner volume 526 of the protective tube 524. Bonding 530 between the tip 522 and the protective tube 524 provides vacuum seal round the sensor positioned in the sensor well 528. The boding 530 may be a brazing bond, or other suitable bonding material. The sensor well 528 may be sized to allow a sensor, such as a thermal couple, to be spring loaded therein. The tip 522 and the protective tube 524 may be formed from different materials. In one embodiment, the tip 502 is formed from a material having a higher thermal conductivity and the protective tube 524 is formed from a material having a lower thermal conductivity. The higher thermal conductivity in the tip 522 allows the tip 522 to have rapid response to temperature changes in the component to be measured and the lower thermal conductivity in the protective tube 524 reduces thermal loss in the component being measured from the contact of the sensor housing 520. In one embodiment, the tip 522 is formed from aluminum nitride and the protective tube 524 is formed from aluminum oxide.

FIG. 5C is a schematic sectional view of a sensor housing 540 according to embodiments of the present disclosure. The sensor housing 540 is similar to the sensor housing 520 except a protective tube 544 is joined to a tip 542. The protective tube 544 and the tip 542 define an inner volume 546. The tip 542 has one or more sensor embedded therein.

Figure 6:
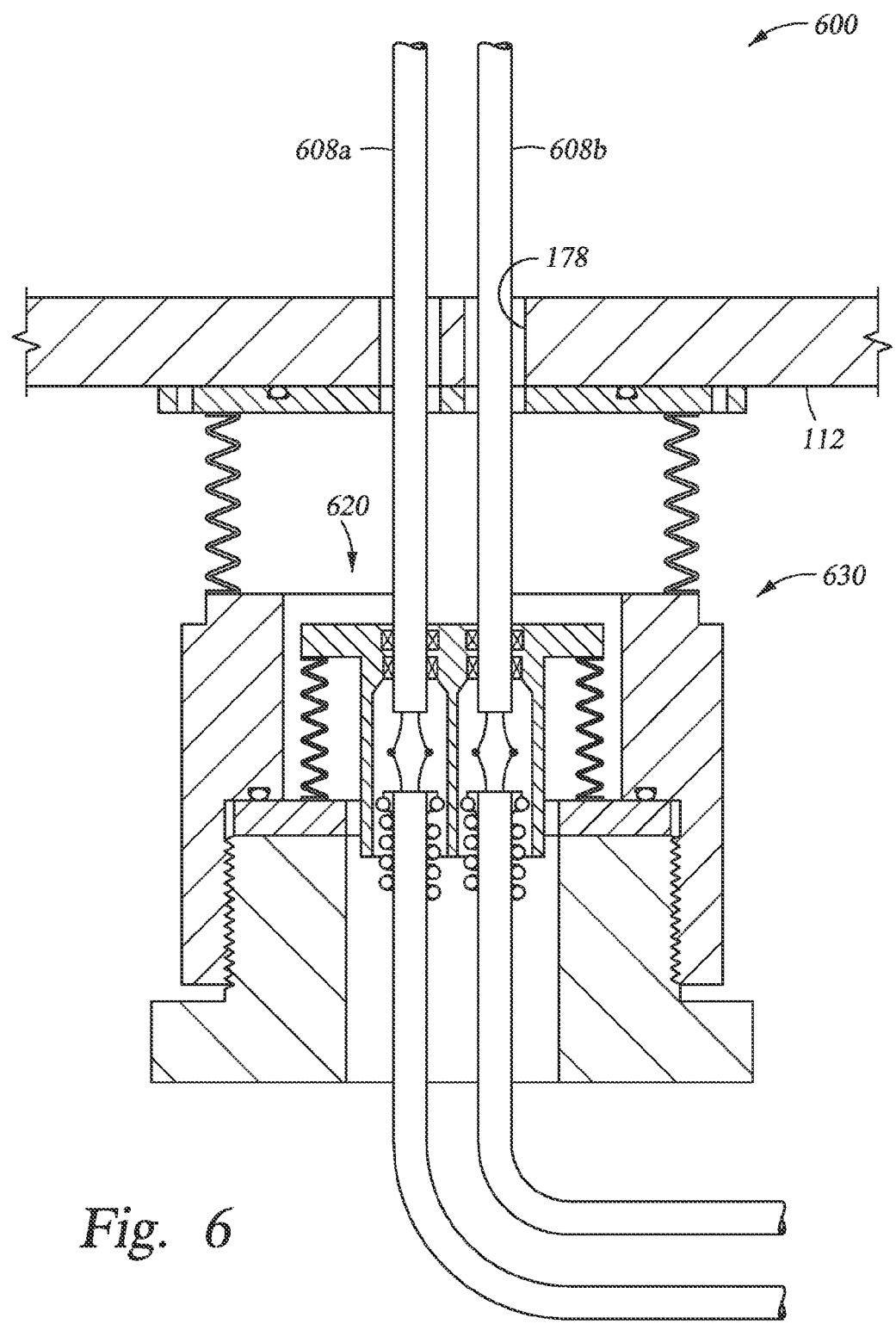
FIG. 6 is a schematic partial sectional view of a sensor column according to another embodiment of the present disclosure.

FIG. 6 is a schematic partial sectional view of a sensor column 600 according to another embodiment of the present disclosure. The sensor column 600 is similar to the sensor column 200 of FIG. 2 except the sensor column 600 includes at least two protective tubes 608a, 608b each having one or more sensors disposed therein. The at least two protective tubes 608a, 608b may be parallel to one another. An inner bellows 620 and an outer bellows 630 surround the at least two protective tubes 608a, 608b.

FIG. 7A is a schematic sectional view of a processing chamber 700 having at least two sensor columns 760a, 760b according to one embodiment of the present disclosure. The at least two sensor columns 760a, 760b are positioned corresponding to different locations 780a, 780b of the substrate support assembly 130, for example at different radii, through different openings 778a. Each of the at least two sensor columns 760a, 760b includes a protective tube 764a, 764b surrounded by a bellows 774a, 774b. A bracket 704 may be fixedly coupled between the protective tubes 764a, 764b and the substrate support assembly 130 so that the sensor columns 760a, 760b move vertically with the substrate support assembly 130.

Figure 7B:
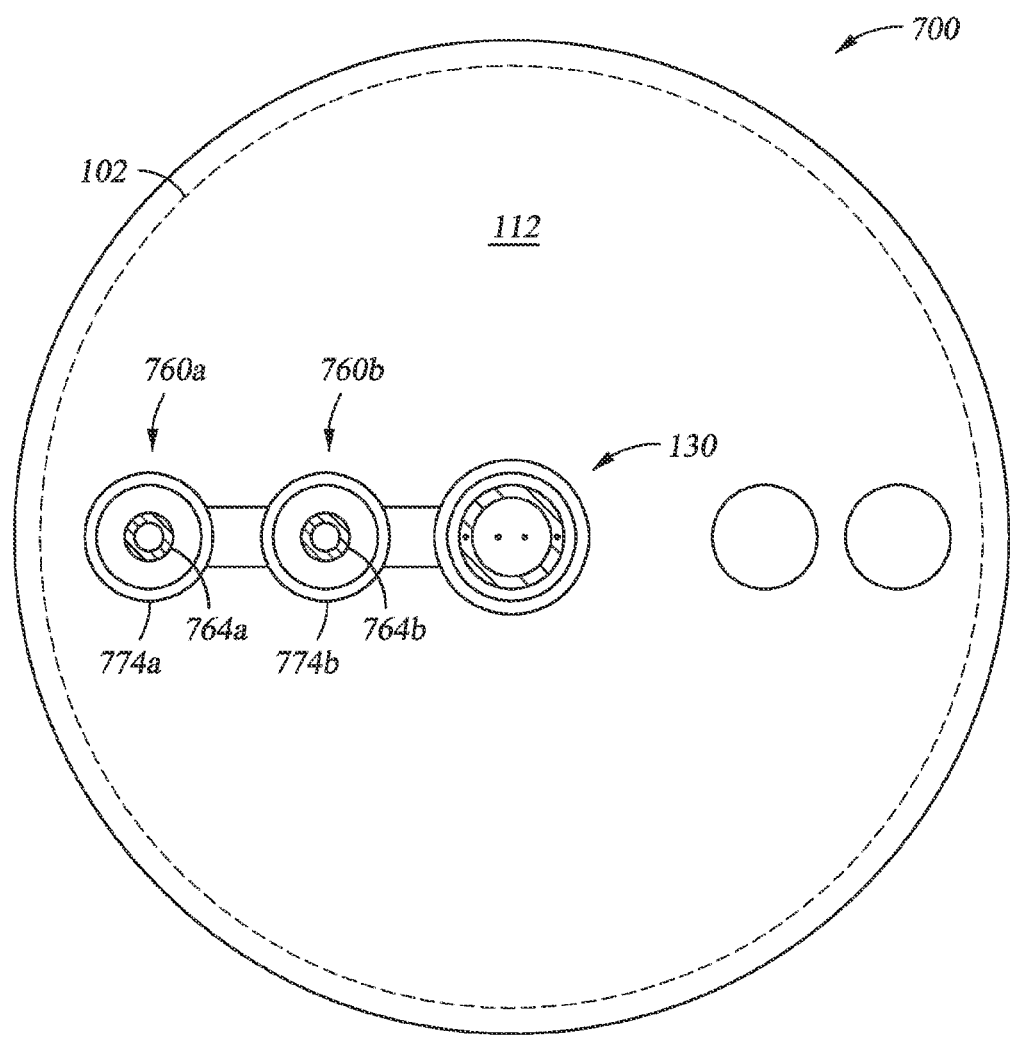
FIG. 7B is a schematic partial bottom view of the processing chamber of FIG. 7A.

FIG. 7B is a schematic partial bottom view of the processing chamber 700 of FIG. 7A. The at least two sensor columns 760a, 760b are positioned to measure temperatures corresponds to locations of different radii of the substrate 102 being processed.

Figure 7C:
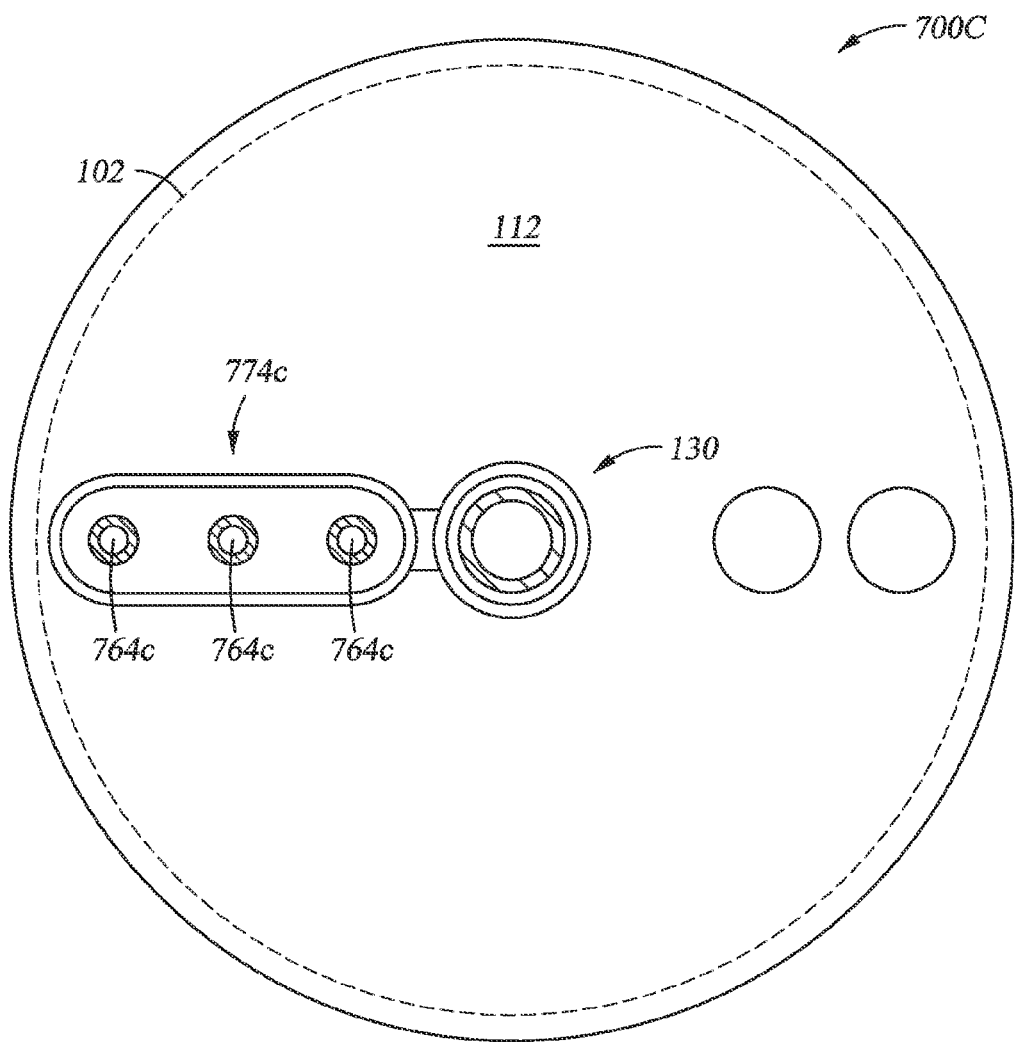
FIG. 7C is a schematic partial bottom view of a processing chamber according to another embodiment of the present disclosure.

FIG. 7C is a schematic partial bottom view of a processing chamber 700C according to another embodiment of the present disclosure. The processing chamber 700C is similar to the processing chamber 700 except that the processing chamber 700C includes a plurality of sensor columns 764c inside a single bellows 774c.

FIG. 8 is a schematic partial sectional view of a processing chamber 800 having a sensor column 860 according another embodiment of the present disclosure. The processing chamber 800 is similar to the processing chamber 100 except the sensor column 860 is driven by an actuator 802 different than the actuator 104 for the substrate support assembly 130. A controller 804 may be connected to the actuators 802 and 104 so that the actuator 802 is a slave to the actuator 104 or vise versa to achieve synchronization.

Embodiments of the present disclosure may be used to in other processing chambers, such as plasma enhanced chemical vapor deposition chambers, metal organic chemical vapor deposition chambers, atomic vapor deposition chamber, UV treatment chambers.

While the foregoing is directed to embodiments of the present disclosure, other and further embodiments of the disclosure may be devised without departing from the basic scope thereof, and the scope thereof is determined by the claims that follow.

The invention claimed is:

1. A substrate support assembly comprising:
    a substrate support body having an upper surface for supporting a substrate thereon;
    a central support shaft extending from a backside of the substrate support body, wherein the central support shaft is movable along a longitudinal axis to move the substrate support body; and
    a sensor column disposed radially outward of the central support shaft and having a tip with a sensor disposed therein, the tip contacting the backside of the substrate support body, wherein the sensor column is synchronically movable with the central support shaft to maintain the contact between the tip and the backside of the substrate support body.

2. The substrate support assembly of claim 1, wherein the substrate support body comprises one or more heaters therein for heating the substrate, and the sensor comprises a temperature sensor for measuring a temperature of the substrate support body.

3. The substrate support assembly of claim 1, wherein the sensor column comprises:
    a protective tube attached to the tip, wherein the protective tube has a first end and a second end, the first end is attached to the tip, the protective tube is positioned such that a line connecting the first end and the second end is parallel to the longitudinal axis of the central support shaft, and the inner volume of the protective tube houses connectors of the sensor.

4. The substrate support assembly of claim 3, wherein the sensor column further comprises:
    an inner bellows surrounding the protective tube, wherein a first end of the inner bellows is attached to the protective tube adjacent the second end of the protective tube, and the inner bellows exerts a force to bias the protective tube towards the backside of the substrate support body when a second end of the inner bellows is moved relative to the first end of the inner bellows.

5. The substrate support assembly of claim 4, wherein the sensor column further comprises:
    an outer bellows surrounding the inner bellows, wherein the second end of the inner bellows is connected with the outer bellows, and the outer bellows is positioned to provide a sealed environment to the inner bellows, the protective tube, and the tip.

6. The substrate support assembly of claim 5, further comprising:
    one or more additional sensor columns disposed radially outward from the central support shaft, wherein one of the one or more additional sensor columns is positioned parallel to the central support shaft, wherein each of the one or more additional sensor columns comprises:
        a tip contacting the backside of the substrate support body;

a sensor disposed in the tip; and
a protective tube attached to the tip.

7. The substrate support assembly of claim 6, wherein each of the sensor columns is positioned to contact a different radial location of the substrate support body.

8. The substrate support assembly of claim 7, further comprising one or more additional inner bellows, wherein each of the additional inner bellows surrounds and is attached to each of the protective tubes of the one or more additional sensor columns.

9. The substrate support assembly of claim 8, further comprising one or more additional outer bellows, wherein each of the additional outer bellows surrounds and is connected with each of the additional inner bellows.

10. The substrate support assembly of claim 3, wherein the tip and the protective tube is an unitary body, the first end of the protective tube is closed to form the tip, a sensor well is formed inside the tip, the sensor well opens to the inner volume of the protective tube to receive the sensor therein.

11. The substrate support assembly of claim 3, wherein tip is bonded to the first end of the protective tube, the tip is formed from a first material, the protective tube is formed from a second material, and the first material has a higher thermal conductivity than the second material.

12. The substrate support of claim 11, wherein the tip includes a sensor well open to the inner volume of the protective tube to receive the sensor therein.

13. A processing chamber, comprising:
a chamber body defining a processing volume; and
a substrate support assembly, wherein the substrate support assembly comprises:
    a substrate support body disposed in the processing volume having an upper surface for supporting a substrate thereon;
    a central support shaft extending from a backside of the substrate support body to an exterior of the chamber body through a shaft opening formed through the chamber body, wherein the central support shaft is movable along a longitudinal axis to move the substrate support body; and
    a sensor column disposed radially outward from the central support shaft and having a tip with a sensor disposed therein, the tip contacting the backside of the substrate support body, wherein the sensor column extends to exterior of the chamber body through a sensor opening formed through the chamber body, the sensor column is synchronically movable with the central support shaft to maintain the contact between the tip and the backside of the substrate support body.

14. The processing chamber of claim 13, further comprising a bracket disposed outside the processing volume, wherein the bracket is coupled between the central support shaft and the sensor column so that the central support shaft and the sensor column are driven by one single actuator.

* * * * *